(12) United States Patent  (10) Patent No.: US 9,444,409 B2
Lozhkin  (45) Date of Patent: Sep. 13, 2016

(54) AMPLIFICATION DEVICE AND AMPLIFICATION METHOD

(71) Applicant: FUJITSU LIMITED, Kawasaki-shi, Kanagawa (JP)

(72) Inventor: Alexander Nikolaevich Lozhkin, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/873,882

(22) Filed: Oct. 2, 2015

(65) Prior Publication Data

US 2016/0181991 A1 Jun. 23, 2016

(30) Foreign Application Priority Data

Dec. 18, 2014 (JP) .................................. 2014-256558

(51) Int. Cl.
H03F 3/68 (2006.01)
H03F 1/02 (2006.01)
H03F 1/32 (2006.01)

(52) U.S. Cl.
CPC .............. *H03F 1/0294* (2013.01); *H03F 1/32* (2013.01); *H03F 2200/324* (2013.01)

(58) Field of Classification Search
None
See application file for complete search history.

(56) References Cited

U.S. PATENT DOCUMENTS

| 5,929,702 | A | * | 7/1999 | Myers | ................... | H03F 1/0222 330/10 |
| 7,460,843 | B2 | | 12/2008 | Ikedo | | |
| 7,729,445 | B2 | | 6/2010 | Ravi et al. | | |
| 7,738,619 | B2 | | 6/2010 | Hasson et al. | | |
| 9,197,465 | B2 | * | 11/2015 | Ma | ....................... | H04L 25/4902 |
| 2004/0108900 | A1 | * | 6/2004 | Apel | ..................... | H03F 1/0244 330/285 |
| 2004/0263246 | A1 | * | 12/2004 | Robinson | .............. | H03F 1/0244 330/124 R |
| 2007/0123184 | A1 | | 5/2007 | Nesimoglu et al. | | |

(Continued)

FOREIGN PATENT DOCUMENTS

| JP | 2006-295900 | 10/2006 |
| JP | 2008-124540 | 5/2008 |

(Continued)

OTHER PUBLICATIONS

Hongtak Lee, et al., "A CMOS Power Amplifier for Multi-mode LINC Architecture", Radio and Wireless Symposium (RWS), 2010, pp. 41-44 (4 pages).

*Primary Examiner* — Patricia T Nguyen
(74) *Attorney, Agent, or Firm* — Fujitsu Patent Center

(57) ABSTRACT

An amplification device includes at least two amplifiers. The amplification device further includes: a switching unit that switches an amplification mode to one of a first amplification mode and a second amplification mode based on power of a signal before or after amplification by the amplifiers; a separating unit that separates an input signal to two signals having a constant amplitude and different phases from each other when switched to the first amplification mode by the switching unit; a modulation unit that modulates an input signal into a signal having a constant amplitude when switched to the second amplification mode by the switching unit; an amplification unit that amplifies the two signals obtained by the separating unit or two signals obtained by the modulation unit by using the amplifiers; and a combining unit that combines the two signals amplified by the amplifiers.

6 Claims, 5 Drawing Sheets

(56) References Cited

U.S. PATENT DOCUMENTS

| | | | | |
|---|---|---|---|---|
| 2009/0322421 | A1* | 12/2009 | Mueller | H03F 1/0261 330/124 R |
| 2010/0289578 | A1* | 11/2010 | Cao | H03F 3/24 330/251 |
| 2015/0270806 | A1* | 9/2015 | Wagh | H03F 3/211 330/296 |
| 2015/0303961 | A1* | 10/2015 | Banerjee | H03F 3/211 375/287 |

FOREIGN PATENT DOCUMENTS

| | | |
|---|---|---|
| JP | 2008-167289 | 7/2008 |
| JP | 2009-517912 | 4/2009 |
| WO | 2007064007 | 6/2007 |

\* cited by examiner

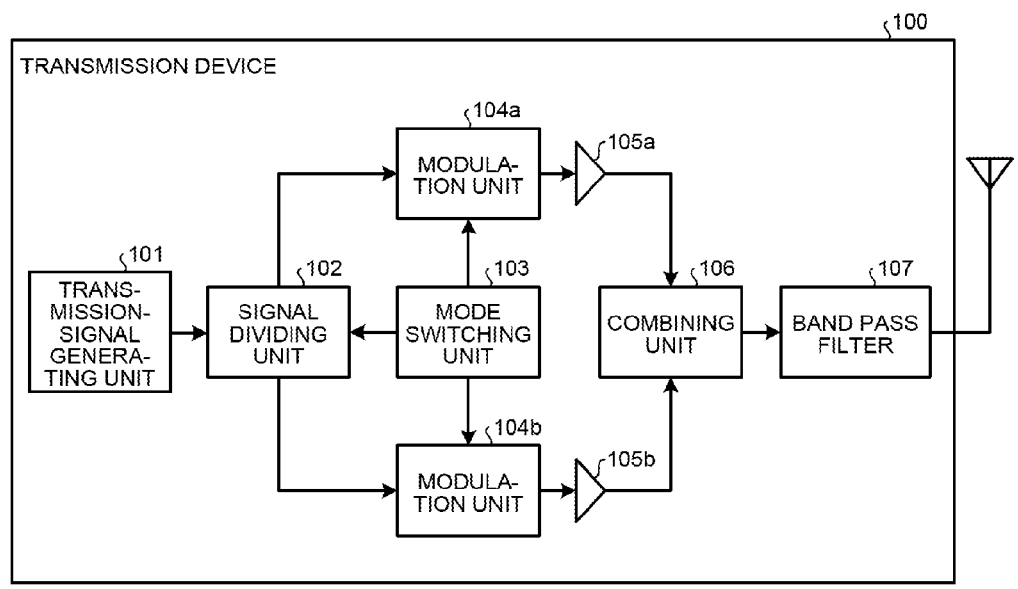
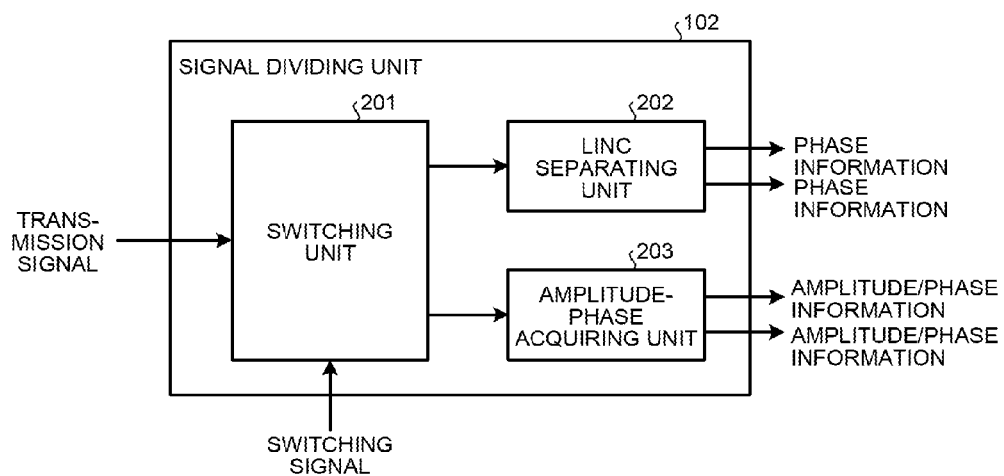

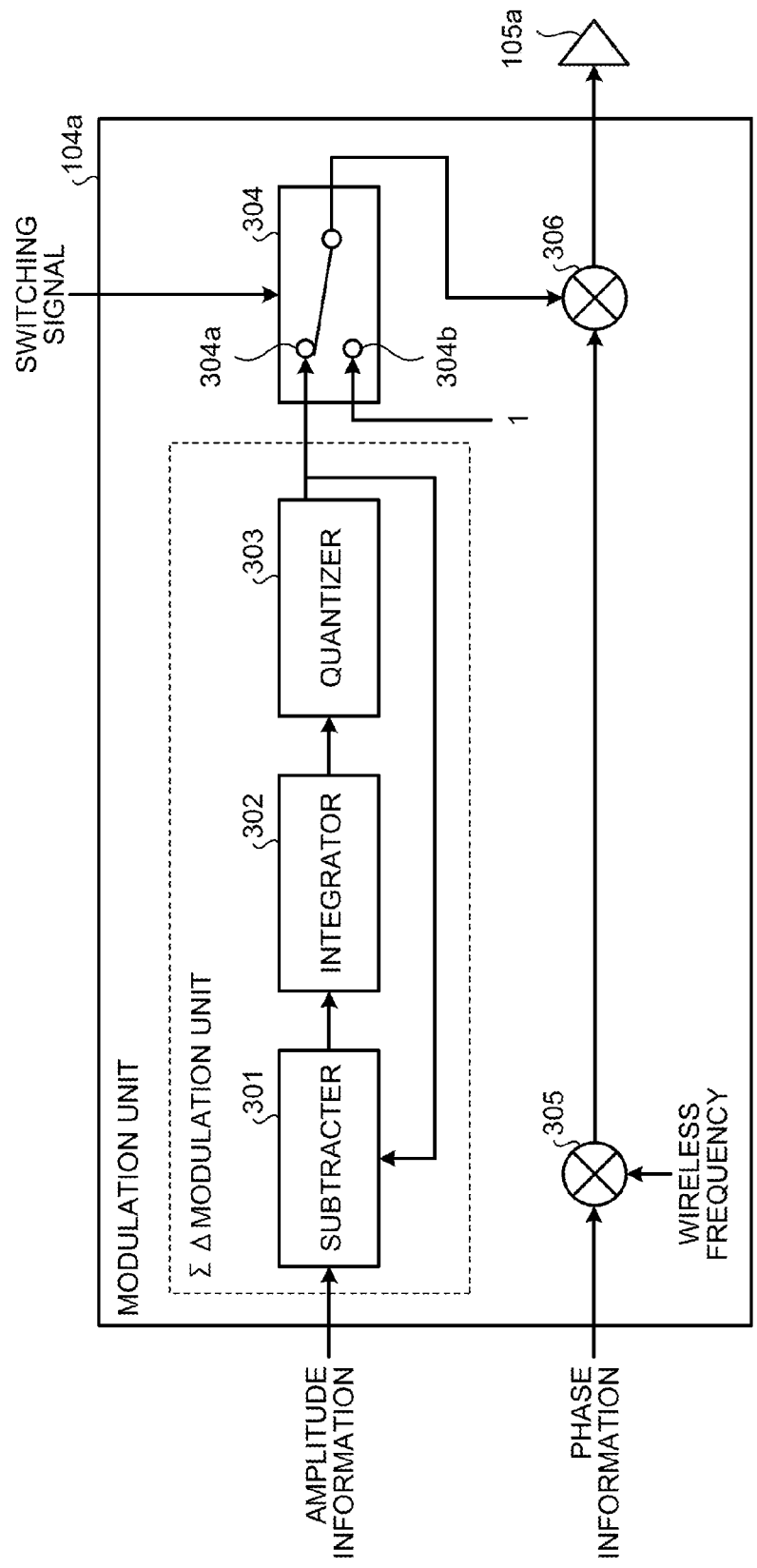

FIG.5
(a)
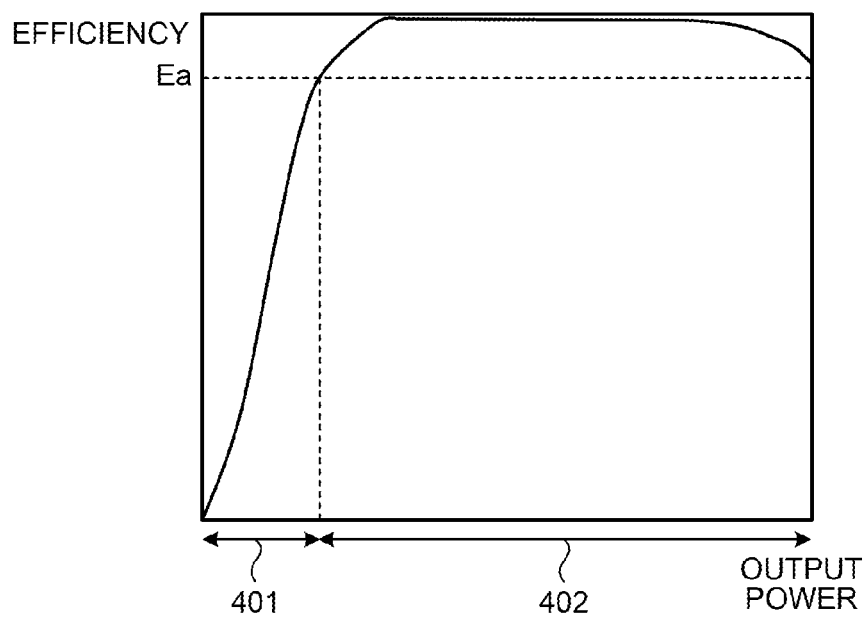
(b)
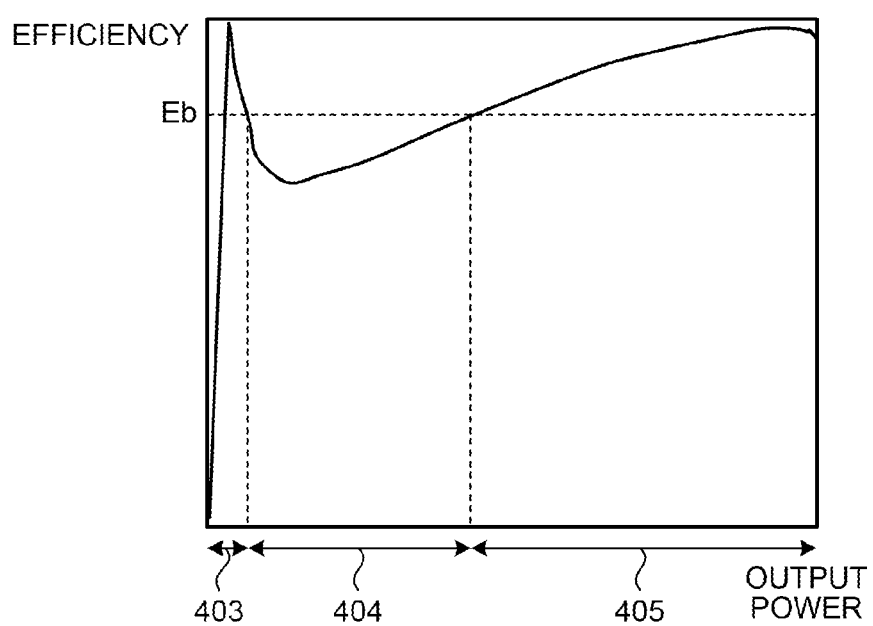

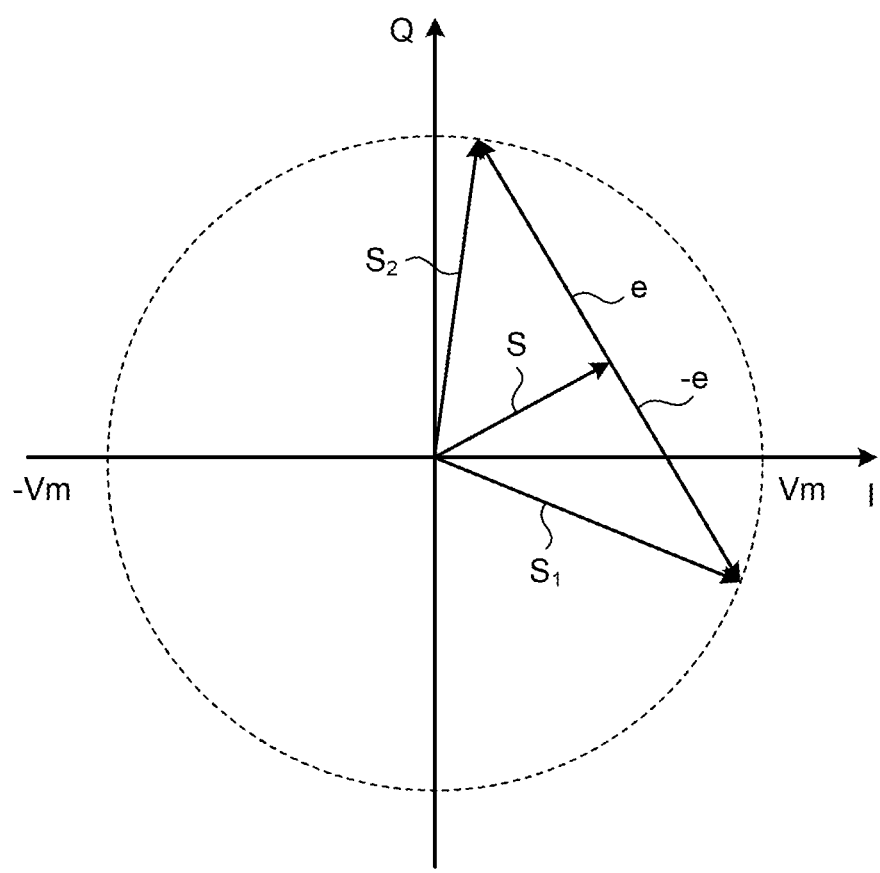

AMPLIFICATION DEVICE AND AMPLIFICATION METHOD

CROSS-REFERENCE TO RELATED APPLICATION

This application is based upon and claims the benefit of priority of the prior Japanese Patent Application No. 2014-256558, filed on Dec. 18, 2014, the entire contents of which are incorporated herein by reference.

FIELD

The embodiments discussed herein are related to an amplification device and an amplification method.

BACKGROUND

In recent years, an amplification circuit called LINC (linear amplification with nonlinear components) has been attracting attention to improve power efficiency of an amplifier equipped in a wireless communication device, for example. LINC is an amplification circuit that uses an outphasing scheme, and that divides an input signal into signals having different phases with a constant amplitude, and amplifies each of the divided signals with respective amplifiers.

Specifically, for example, as indicated on an IQ plane in FIG. 6, an input signal S is divided into a signal $S_1$ and a signal $S_2$ with an amplitude of Vm. The signal $S_1$ and the signal $S_2$ are amplified by respective amplifiers, and output signals of the respective amplifiers are combined. At this time, if the power of the input signal S varies, although the phase difference between the signal $S_1$ and the signal $S_2$ varies, the amplitude is constant at Vm. Therefore, each of the amplifiers amplifies signals at a constant power level, and occurrence of intermodulation distortion can be suppressed. Accordingly, it is possible to activate an amplifier in a nonlinear region in which linearity of input and output cannot be maintained, and the power efficiency can be improved by keeping the input power level for an amplifier comparatively high.

In LINC, as indicated in FIG. 6, the input signal S is divided into the signal $S_1$ and the signal $S_2$ having different phases. At this time the amplitude of the input signal S is reflected in the phases of the signal $S_1$ and the signal $S_2$. That is, when the amplitude of the input signal S increases, the phase difference between the signal $S_1$ and the signal $S_2$ decreases. On the other hand, when the amplitude of the input signal S decreases, the phase difference between the signal $S_1$ and the signal $S_2$ increases. In FIG. 6, as the amplitude of the input signal S decreases, the angle between the signal $S_1$ and the signal $S_2$ increases, and an unnecessary outphasing component e increases. Therefore, when LINC is used, the power efficiency for an input signal having small amplitude is relatively low.

Therefore, dividing an input signal equally to signals having a phase identical to that of the input signal and performing linear amplification of each of the divided signals by amplifiers when the amplitude of the input signal is small, while applying LINC when the amplitude of an input signal is large have been considered.

Patent document 1: U.S. Pat. No. 7,729,445
Patent document 2: Japanese Laid-open Patent Publication No. 2008-167289
Non-patent document 1: Hongtak Lee, and three others, "A CMOS Power Amplifier for Multi-mode LINC Architecture", *Radio and Wireless Symposium (RWS)*, 2010, pp. 41-44

However, in the above technique, there is a problem that the power efficiency cannot be sufficiently improved when the amplitude of an input signal is small. That is, as described above, in LINC, as the amplitude of an input signal becomes smaller, the phase difference between two signals that are obtained by dividing the input signal becomes larger, and an unnecessary outphasing component increases. To cope with this outphasing component, a back-off of the amplifier increases, and the power efficiency is deteriorated.

Moreover, in the technique in which an input signal is equally divided to perform linear amplification when the amplitude of the input signal is small, the amplitudes of the equally divided signals are not constant, and therefore, intermodulation distortion can occur in an amplifier, or out-of-band emission can occur in output of the amplifier. Further, to suppress the intermodulation distortion or the out-of-band emission, the back-off of the amplifier increases, and the power efficiency is deteriorated.

SUMMARY

According to an aspect of an embodiment, an amplification device includes at least two amplifiers. The amplification device further includes: a switching unit that switches an amplification mode to one of a first amplification mode and a second amplification mode based on power of a signal before or after amplification by the amplifiers; a separating unit that separates an input signal to two signals having a constant amplitude and different phases from each other when switched to the first amplification mode by the switching unit; a modulation unit that modulates an input signal into a signal having a constant amplitude when switched to the second amplification mode by the switching unit; an amplification unit that amplifies the two signals obtained by the separating unit or two signals obtained by the modulation unit by using the amplifiers; and a combining unit that combines the two signals amplified by the amplifiers.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a block diagram indicating a configuration of a transmission device according to an embodiment;

FIG. 2 is a block diagram indicating a configuration of a signal dividing unit according to an embodiment;

FIG. 3 is a block diagram indicating a configuration of a modulation unit according to an embodiment;

FIG. 5 is a diagram explaining a specific example of mode switching; and

FIG. 6 is a diagram explaining a signal separation in LINC.

DESCRIPTION OF EMBODIMENTS

Figure 4:
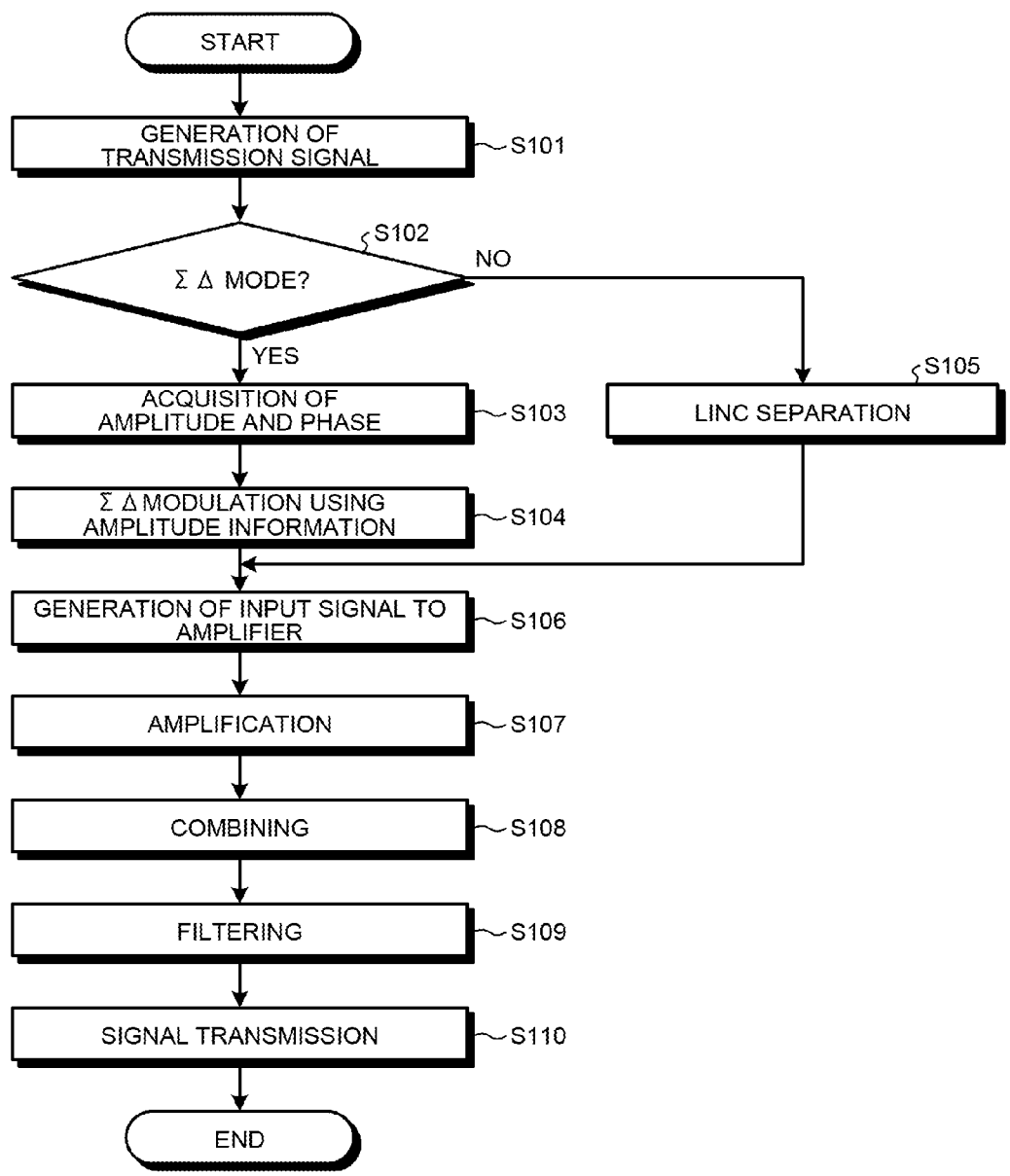
FIG. 4 is a flowchart indicating amplification processing according to an embodiment.

Preferred embodiments of the present invention will be explained with reference to accompanying drawings. The present invention is not limited to these embodiments.

FIG. 1 is a block diagram indicating a configuration of a transmission device 100 according to an embodiment. The transmission device 100 transmits a transmission signal that is amplified by an amplification device. Specifically, the transmission device 100 includes a transmission-signal generating unit 101, a signal dividing unit 102, a mode switching unit 103, a modulation units 104a, 104b, an amplifiers 105a, 105b, a combining unit 106, and a band-pass filter 107.

The transmission-signal generating unit 101 performs encoding, modulation, and the like of data, to generate a transmission signal. The transmission signal generated by the transmission-signal generating unit 101 is a baseband signal.

The signal dividing unit 102 divides a transmission signal generated by the transmission-signal generating unit 101 into two signals. The signal dividing unit 102 outputs the two signals to the modulation units 104a, 104b according to a switching signal that is output from the mode switching unit 103. Specifically, when a switching signal to switch to a $\Sigma\Delta$ mode in which a $\Sigma\Delta$ modulated signal is amplified is output from the mode switching unit 103, the signal dividing unit 102 divides a transmission signal into two signals having the amplitude and the phase same as those of the transmission signal, to output to the modulation units 104a, 104b. In the following, the amplitude of a signal is also referred to as amplitude information, and the phase of a signal is also referred to as phase information. That is, the signal dividing unit 102 outputs two identical signals including the amplitude information and the phase information of a transmission signal to the modulation unit 104a, 104b, respectively.

Meanwhile, when a switching signal to switch to a LINC mode in which a signal is amplified by LINC is output from the mode switching unit 103, the signal dividing unit 102 divides a transmission signal into two signals having a constant amplitude and different phases, to output to the modulation units 104a, 104b. At this time, the signal dividing unit 102 devices the transmission signal into signals the amplitude of which is constant even when the amplitude of the transmission signal increases or decreases. Therefore, the signal dividing unit 102 outputs two signals including phase information different from each other, and having the constant amplitude to the modulation units 104a, 104b, respectively, in the LINC mode. A specific configuration of the signal dividing unit 102 is described in detail later.

The mode switching unit 103 selects either one of the $\Sigma\Delta$ mode in which a $\Sigma\Delta$ modulated signal is amplified and the LINC mode in which a signal is amplified by LINC, and outputs a switching signal corresponding to the selected mode to the signal dividing unit 102 and the modulation units 104a, 104b. At this time, the mode switching unit 103 selects a mode based on, for example, the magnitude of amplitude of the transmission signal that is input to the signal dividing unit 102. That is, the mode switching unit 103 selects a mode based on the power of the transmission signal. Specifically, the mode switching unit 103 compares the power of a transmission signal with a threshold, and selects the $\Sigma\Delta$ mode when the power of the transmission signal is lower than the threshold. Meanwhile, the mode switching unit 103 selects the LINC mode when the power of the transmission signal is equal to or higher than the threshold.

The mode switching unit 103 may select a mode based on the power of a signal that is output from the combining unit 106, not based on the power of a transmission signal input to the signal dividing unit 102. That is, the mode switching unit 103 may switch modes based on the power of a signal that is feedbacked from the combining unit 106.

The modulation units 104a, 104b modulate signals output from the signal dividing unit 102, to output signals having wireless frequencies. Specifically, in the $\Sigma\Delta$ signal, the modulation units 104a, 104b perform $\Sigma\Delta$ modulation on the amplitude information output from the signal dividing unit 102 to acquire constant amplitude information, and output a signal including the acquired constant amplitude information and the phase information output from the signal dividing unit 102 at a wireless frequency. Moreover, in the LINC mode, the modulation units 104a, 104b upconvert a signal output from the signal dividing unit 102 as it is to a wireless frequency to output the signal. A specific configuration of the modulation units 104a, 104b is described in detail later.

The amplifiers 105a, 105b respectively amplify signals output from the modulation units 104a, 104b. At this time, the amplifiers 105a, 105b amplify signals having constant amplitudes either in the $\Sigma\Delta$ mode or the LINC mode. Therefore, occurrence of intermodulation distortion in the amplifiers 105a, 105b can be suppressed.

The combining unit 106 combines signals amplified by the amplifiers 105a, 105b. The band pass filter 107 cuts an unnecessary frequency band of a combined signal obtained by the combining unit 106, to acquire a wireless transmission signal.

Next, a specific configuration of the signal dividing unit 102 is explained. FIG. 2 is a block diagram indicating a configuration of the signal dividing unit 102. As indicated in FIG. 2, the signal dividing unit 102 includes a switching unit 201, a LINC separating unit 202, and an amplitude-phase acquiring unit 203.

The switching unit 201 outputs a transmission signal to the LINC separating unit 202 or the amplitude-phase acquiring unit 203, according to the switching signal that is output from the mode switching unit 103. Specifically, the switching unit 201 outputs a transmission signal to the amplitude-phase acquiring unit 203 in the $\Sigma\Delta$ mode. Moreover, the switching unit 201 outputs a transmission signal to the LINC separating unit 202 in the LINC mode.

The LINC separating unit 202 separates a transmission signal into two signals having a constant amplitude and different phases. That is, the LINC separating unit 202 separates a transmission signal S(t) at a time t into two signals $S_1(t)$ and $S_2(t)$. At this time, the transmission signal S(t) can be expressed as following Equation (1).

$$S(t)=A(t)\cos[\omega t+\phi(t)] \quad (1)$$

A(t) indicates an amplitude at the time t, and cos [$\omega t+\phi(t)$] indicates a phase at the time t. The LINC separating unit 202 separates the transmission signal S(t) expressed by Equation (1) above into the signals $S_1(t)$ and $S_2(t)$ expressed by following Equations (2) and (3).

$$S_1(t)=V_0\cos[\omega t+\phi(t)+\theta(t)] \quad (2)$$

$$S_2(t)=V_0\cos[\omega t+\phi(t)-\theta(t)] \quad (3)$$

$V_0$ indicates a maximum amplitude of the signals $S_1(t)$ and $S_2(t)$, and $\theta(t)$ indicates a value corresponding a phase difference generated as a result of keeping the amplitude of the signals $S_1(t)$ and $S_2(t)$ constant as indicated by Equation (4) below.

$$\theta(t)=\arccos[A(t)/V_0] \quad (4)$$

The LINC separating unit 202 outputs the signals $S_1(t)$ and $S_2(t)$ indicated by Equations (2) and (3) above to the modulation units 104a, 104b, respectively. Because the amplitudes of these signals $S_2(t)$ and $S_2(t)$ are constant irrespective of time, the phase information is to be output to the modulation units 104a, 104b.

The amplitude-phase acquiring unit 203 acquires the amplitude information and the phase information of a transmission signal. The amplitude-phase acquiring unit 203 then outputs the acquired amplitude information and the phase information to the modulation units 104a, 104b. Therefore, the amplitude-phase acquiring unit 203 outputs signals having the amplitude information and the phase information same as those of the transmission signal to the modulation units 104a, 104b. Because the amplitude of the transmission signal changes with time (refer to Equation (1) above), the amplitude information output to the modulation units 104a, 104b also changes with time. The two signals output by the amplitude-phase acquiring unit 203 include the identical amplitude information and phase information, and therefore, the amplitude-phase acquiring unit 203 may output the phase information and the amplitude information only to either one of the modulation units 104a, 104b.

Next, a specific configuration of the modulation units 104a, 104b is explained. Because the modulation units 104a, 104b both have the same configuration, a configuration of the modulation unit 104a is explained below. FIG. 3 is a block diagram indicating a configuration of the modulation unit 104a. As indicated in FIG. 3, the modulation unit 104a includes a subtracter 301, an integrator 302, a quantizer 303, a switch 304, and multipliers 305, 306.

The subtracter 301 subtracts a quantized output feedbacked from the quantizer 303 from amplitude information that is input in the ΣΔ mode. The subtracter 301 calculates a quantization error generated in the quantizer 303 in the ΣΔ mode.

The integrator 302 integrates the quantization error calculated by the subtracter 301. Subsequently, the quantizer 303 quantizes an integrated value of the quantization error to perform analog-digital conversion. That is, the quantizer 303 outputs a digital wave with a constant amplitude. The amplitude of the digital wave that is output by the quantizer 303 may be coincide with the amplitude of a signal output by the LINC separating unit 202. Thus, the amplitude of signals input to the amplifiers 105a and 105b can be the same in both of the ΣΔ mode and the LINC mode.

The subtracter 301, the integrator 302, and the quantizer 303 constitute a ΣΔ modulation unit that performs ΣΔ modulation. Although the ΣΔ modulation is used as a method of converting a transmission signal into a signal with a constant amplitude in the present embodiment, it is also possible to convert a transmission signal into a signal with a constant amplitude, for example, by using pulse width modulation (PWM).

The switch 304 outputs an output of the quantizer 303 or a fixed value 1 to the multiplier 306 according to a switching signal that is output from the mode switching unit 103. Specifically, the switch 304 is switched to a terminal 304a side in the ΣΔ mode, and outputs an output of the quantizer 303 to the multiplier 306. Meanwhile, the switch 304 is switched to a terminal 304b side in the LINC mode, and outputs the fixed value 1 to the multiplier 306.

The multiplier 305 performs upconversion by multiplying the phase information input from the signal dividing unit 102 by a predetermined wireless frequency. Specifically, the multiplier 305 upconverts a signal having the same phase as the transmission signal to the wireless frequency in the ΣΔ mode. Meanwhile the multiplier 305 upconverts a signal that is acquired by separation performed by the LINC separating unit 202 to the wireless frequency.

The multiplier 306 multiplies the signal upconverted into the wireless frequency by the multiplier 305, by an output of the quantizer 303 or by the fixed value 1. Specifically, the multiplier 306 multiplies the phase same as that of the transmission signal by the constant amplitude that is acquired by the ΣΔ modulation unit, to output a signal having the same phase as the transmission signal and the constant amplitude in the ΣΔ mode. Meanwhile, the multiplier 306 multiplies the signal that is acquired by separation performed by the LINC separating unit 202 by the fixed value 1, to output the acquired by separation performed by the LINC separating unit 202 as it is in the LINC mode.

Next, amplification processing in the transmission device 100 configured as described above is explained with reference to a flowchart indicated in FIG. 4.

First, encoding, modulation, and the like of data are performed by the transmission-signal generating unit 101, to generate a baseband transmission signal (step S101). The generated transmission signal is output to the signal dividing unit 102.

The switching unit 201 of the signal dividing unit 102 determines whether a switching signal output from the mode switching unit 103 indicates the ΣΔ mode or the LINC mode (step S102). When the switching unit 201 determines a mode, the transmission signal is output to a destination according to the mode. Specifically, in the ΣΔ mode (step S102: YES), the transmission signal is output to the amplitude-phase acquiring unit 203, and in the LINC mode (step S102: NO), the transmission signal is output to the LINC separating unit 202.

Mode switching performed by the mode switching unit 103 is specifically explained. FIG. 5 is a diagram explaining a specific example of the mode switching performed by the mode switching unit 103. FIGS. 5(a), (b) indicate specific examples of relation between output power and efficiency when a transmission signal is amplified in the LINC mode. For example, if the amplifiers 105a, 105b have characteristics indicated in FIG. 5(a), the mode is switched to the ΣΔ mode when the efficiency in the LINC mode is lower than Ea, and the mode is switched to the LINC mode when the efficiency in the LINC mode is equal to or higher than Ea. Therefore, when the output power is included in a section 401, the mode is switched to the ΣΔ mode, and when the output power is included in a section 402, the mode is switched to the LINC mode.

Similarly, for example, if the amplifiers 105a, 105b have characteristics indicated in FIG. 5(b), the mode is switched to the ΣΔ mode when the efficiency in the LINC mode is lower than Eb, and the mode is switched to the LINC mode when the efficiency in the LINC mode is equal to or higher than Eb. Therefore, when the output power is included in a section 404, the mode is switched to the ΣΔ mode, and when the output power is included in a section 403 or a section 405, the mode is switched to the LINC mode.

As described, the mode is determined according to the output power after a transmission signal is amplified, and a switching signal is output to the signal dividing unit 102 and the modulation units 104a, 104b from the mode switching unit 103. Because the output power corresponds to power of a combined signal that is obtained by the combining unit 106, the mode switching unit 103 can determine the mode based on the power of the combined signal. Moreover, the mode switching unit 103 may also determine the mode based on the power of a transmission signal that is input to the signal dividing unit 102. When the mode is determined based on the power of a transmission signal input to the signal dividing unit 102, the mode switching unit 103 switches to the ΣΔ mode, for example, when the power of a transmission signal is lower than a predetermined threshold, and switches to the LINC mode when the power of a transmission signal is equal to or higher than the predetermined threshold.

Referring back to FIG. 4, when a switching signal to switch modes is output from the mode switching unit 103, the switching unit 201 of the signal dividing unit 102 outputs the transmission signal to a destination corresponding to the mode. That is, in the ΣΔ mode (step S102: YES), the transmission signal is output to the amplitude-phase acquiring unit 203, and in the LINC mode (step S102: NO), the transmission signal is output to the LINC separating unit 202.

Subsequently, in the ΣΔ mode, the amplitude-phase acquiring unit 203 acquires the amplitude information and the phase information of the transmission signal (step S103), to output to the modulation units 104a, 104b. At this time, in the ΣΔ mode, the amplitude information and the phase information of the transmission signal may be output only to either one of the modulation units 104a, 104b. The ΣΔ modulation using the amplitude information of the transmission signal is then performed by the subtracter 301 of the modulation units 104a, 104b (step S104). Specifically, a quantization error is calculated by subtracting a quantization output of the quantizer 303 from the amplitude information, the quantization error is integrated by the integrator 302, and the integrated value is quantized by the quantizer 303. By this ΣΔ modulation, constant amplitude information is acquired from varying amplitude information of the transmission signal. Because the switch 304 is switched to the terminal 304a side by the switching signal in the ΣΔ mode, the constant amplitude information is output to the multiplier 306.

Furthermore, the phase information of the transmission signal is upconverted to a wireless frequency by the multiplier 305, to be output to the multiplier 306. The multiplier 306 then multiplies the phase information that has been upconverted to the wireless frequency by the constant amplitude information, and a signal to be input to the amplifiers 105a, 105b is generated (step S106).

On the other hand, in the LINC mode, LINC separating unit 202 separates the transmission signal into two signals having a constant amplitude and different phases (step S105). The phase information of the two signals acquired by separation is respectively output to the modulation units 104a, 104b. The phase information is upconverted to a wireless frequency by the multiplier 305, to be output to the multiplier 306. Moreover, because the switch 304 is switched to the terminal 304b side by the switching signal in the LINC mode, the fixed value 1 is output to the multiplier 306. The multiplier 306 multiplies the phase information that has been upconverted to the wireless frequency by the fixed value 1, and a signal to be input to the amplifiers 105a, 105b is generated (step S106).

The signals generated by the multiplier 306 have a constant amplitude in either of the ΣΔ mode and the LINC mode. These signals are amplified by the amplifiers 105a, 105b (step S107). At this time, because the amplitude is constant, occurrence of intermodulation distortion in the amplifiers 105a, 105b can be suppressed in either of the ΣΔ mode and the LINC mode.

The signals amplified by the amplifiers 105a, 105b is combined by the combining unit 106 (step S108). The acquired combined signal is filtered by the band pass filter 107 (step S109), to be transmitted from an antenna (step S110). In the ΣΔ mode, quantization noise occurs in a high frequency region due to noise shaping by the ΣΔ modulation. Therefore, the quantization noise in a high frequency region is removed by filtering with the band pass filter 107, and the quality of the transmission signal is thereby improved.

As described above, according to the present embodiment, the mode is switched to either to the ΣΔ mode in which a transmission signal is ΣΔ modulated to be amplified or to the LINC mode in which a transmission signal is separated into signals having a constant amplitude and different phases to be amplified, based on the input power before amplification or the output power after amplification. Therefore, when the input power or the output power is within a range in which the efficiency in the LINC mode is degraded, the mode is switched to the ΣΔ mode, and a signal having a constant amplitude is generated by the ΣΔ modulation, and thus, amplification by an amplifier is enabled. Accordingly, the amplifier is to amplify a signal having a constant amplitude in either mode, and occurrence of intermodulation distortion can be suppressed. As a result, back-off of the amplifier can be reduced and the power efficiency can be improved.

The processing performed by the transmission-signal generating unit 101, the signal dividing unit 102, and the mode switching unit 103 explained in the above embodiment may be executed by a processor such as a CPU (central processing unit) and a DSP (digital signal processor) included in the transmission device 100. In this case, the processor performs various kinds of calculation processing while storing data and the like used therefor in a memory.

According to an aspect of an embodiment of amplification device and the amplification method disclosed in the present application, an effect of improving power efficiency is obtained.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplification device that includes at least two amplifiers, the amplification device comprising:
   a switching unit that switches an amplification mode to one of a first amplification mode and a second amplification mode based on power of a signal before or after amplification by the amplifiers;
   a separating unit that separates an input signal to two signals having a constant amplitude and different phases from each other when switched to the first amplification mode by the switching unit;
   a modulation unit that modulates an input signal into a signal having a constant amplitude when switched to the second amplification mode by the switching unit;
   an amplification unit that amplifies the two signals obtained by the separating unit or two signals obtained by the modulation unit by using the amplifiers; and
   a combining unit that combines the two signals amplified by the amplifiers.

2. The amplification device according to claim 1, wherein the modulation unit modulates the input signal into the signal having the constant amplitude by $\Sigma\Delta$ modulation.

3. The amplification device according to claim 1, wherein the modulation unit modulates the input signal into the signal having the constant amplitude by pulse width modulation.

4. The amplification device according to claim 1, wherein the switching unit switches to the first amplification mode when the power of the signal before or after the amplification is equal to or higher than a predetermined threshold, and switches to the second amplification mode when the power of the signal before or after the amplification is lower than the predetermined threshold.

5. The amplification device according to claim 1, wherein the modulation unit modulates the input signal into a signal having an amplitude that coincides with an amplitude of the two signals obtained by the separating unit.

6. An amplification method in an amplification device that includes at least two amplifiers, the amplification method comprising switching an amplification mode to one of a first amplification mode and a second amplification mode based on power of a signal before or after amplification by the amplifiers;

separating an input signal to two signals having a constant amplitude and different phases from each other when switched to the first amplification;

modulating an input signal into a signal having a constant amplitude when switched to the second amplification mode;

amplifying the two signals obtained by separation performed in the first amplification mode or two signals obtained by modulation performed in the second amplification mode, by using the amplifiers; and combining the two signals amplified by the amplifiers.

* * * * *